United States Patent
Kikuchi et al.

(10) Patent No.: US 10,601,394 B2
(45) Date of Patent: Mar. 24, 2020

(54) ELASTIC WAVE DEVICE AND MANUFACTURING METHOD THEREOF

(71) Applicant: Murata Manufacturing Co., Ltd., Nagaokakyo-shi, Kyoto-fu (JP)

(72) Inventors: Taku Kikuchi, Nagaokakyo (JP); Akira Michigami, Nagaokakyo (JP); Daisuke Sekiya, Nagaokakyo (JP); Masashi Tsubokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 464 days.

(21) Appl. No.: 15/430,887

(22) Filed: Feb. 13, 2017

(65) Prior Publication Data
US 2017/0155372 A1     Jun. 1, 2017

Related U.S. Application Data

(63) Continuation of application No. PCT/JP2015/078583, filed on Oct. 8, 2015.

(30) Foreign Application Priority Data

Oct. 20, 2014   (JP) .................................. 2014-213806

(51) Int. Cl.
*H03H 9/145* (2006.01)
*H03H 3/08* (2006.01)
(Continued)

(52) U.S. Cl.
CPC .............. *H03H 9/145* (2013.01); *H03H 3/08* (2013.01); *H03H 9/02897* (2013.01);
(Continued)

(58) Field of Classification Search
CPC ................................ H03H 9/145; H03H 9/25
See application file for complete search history.

(56) References Cited

U.S. PATENT DOCUMENTS

2005/0012435 A1   1/2005  Nakano et al.
2008/0204167 A1   8/2008  Takamine
(Continued)

FOREIGN PATENT DOCUMENTS

CN     102687395 A     9/2012
JP     2005-039676 A   2/2005
(Continued)

OTHER PUBLICATIONS

Official Communication issued in International Patent Application No. PCT/JP2015/078583, dated Nov. 17, 2015.

*Primary Examiner* — J. San Martin
(74) *Attorney, Agent, or Firm* — Keating & Bennett, LLP

(57) ABSTRACT

An elastic wave device includes interdigital transducer electrodes on a piezoelectric substrate and wires electrically connected to the interdigital transducer electrodes. The wires include a first wire and a second wire. The device further includes an interlayer insulating film made from an inorganic dielectric material and covering a portion of the first wire. A portion of the second wire bridges a portion of the first wire with the interlayer insulating film provided therebetween. In a region, in a bridged area, where the second wire extends from a region on an outer side portion of the interlayer insulating film to above the interlayer insulating film, first auxiliary wire electrodes are provided on the piezoelectric substrate, such that when viewed in plan view, the first auxiliary wire electrodes at least partially overlap with the second wire and extend to within the interlayer insulating film.

11 Claims, 7 Drawing Sheets

(51) Int. Cl.
    *H03H 9/02* (2006.01)
    *H03H 9/64* (2006.01)
    *H03H 9/10* (2006.01)
    *H03H 9/25* (2006.01)
    *H03H 9/54* (2006.01)

(52) U.S. Cl.
    CPC ............ *H03H 9/1071* (2013.01); *H03H 9/25* (2013.01); *H03H 9/54* (2013.01); *H03H 9/6433* (2013.01)

(56) References Cited

U.S. PATENT DOCUMENTS

| | | |
|---|---|---|
| 2010/0327694 A1 | 12/2010 | Omote et al. |
| 2012/0279795 A1 | 11/2012 | Furukawa et al. |
| 2014/0003017 A1 | 1/2014 | Kai et al. |
| 2017/0373667 A1* | 12/2017 | Murase ............... H01L 41/1873 |

FOREIGN PATENT DOCUMENTS

| | | |
|---|---|---|
| JP | 2005-223809 A | 8/2005 |
| JP | 2007-259430 A | 10/2007 |
| JP | 2009-182407 A | 8/2009 |
| JP | 2012-009989 A | 1/2012 |
| JP | 5141852 B2 | 2/2013 |
| WO | 2007/055077 A1 | 5/2007 |
| WO | 2009/116222 A1 | 9/2009 |
| WO | 2011/089906 A1 | 7/2011 |

\* cited by examiner

ELASTIC WAVE DEVICE AND MANUFACTURING METHOD THEREOF

CROSS REFERENCE TO RELATED APPLICATIONS

This application claims the benefit of priority to Japanese Patent Application No. 2014-213806 filed on Oct. 20, 2014 and is a Continuation Application of PCT Application No. PCT/JP2015/078583 filed on Oct. 8, 2015. The entire contents of each application are hereby incorporated herein by reference.

BACKGROUND OF THE INVENTION

1. Field of the Invention

The present invention relates to an elastic wave device including an area on a piezoelectric substrate where a plurality of wires have a bridged structure, and to a method for manufacturing such a device.

2. Description of the Related Art

Elastic wave devices have thus far been widely used as duplexers in cellular phones and the like. With this type of elastic wave device, a very large number of wires are routed on the piezoelectric substrate. Accordingly, a structure in which, on a piezoelectric substrate, wires bridge each other with an inorganic insulating film provided therebetween is known, as disclosed in Japanese Patent No. 5141852. According to Japanese Patent No. 5141852, interdigital transducer electrodes and wires having bridged areas are formed on the piezoelectric substrate. A support member and a cover material made from a resin are also laminated onto the piezoelectric substrate, forming a hollow area.

Meanwhile, according to International Publication No. WO 2009/116222, interdigital transducer electrodes and wires having bridged areas are provided on a piezoelectric substrate. The bridged areas are exposed from an opening provided in a support member made from a resin such that the bridged areas are not covered by the support member.

Japanese Unexamined Patent Application Publication No. 2009-182407, discloses bridged areas of wires having an interlayer insulating film made from a resin being provided on a substrate.

According to the elastic wave device disclosed in Japanese Patent No. 5141852, there is a risk that at the bridged areas, cracks or wire breakage will arise in the wires on the inorganic insulating film due to non-planarities in the inorganic insulating film or non-planarities produced by wires in lower areas. There is a further problem in that differences in the coefficient of linear expansion between the support member made from a resin and the piezoelectric substrate make it easy for a large amount of thermal stress to arise in the wires on the inorganic insulating film.

On the other hand, in International Publication No. WO 2009/116222, the bridged areas are not covered by the support member made from a resin. Accordingly, thermal stress can be alleviated. However, this reduces the freedom of design and makes it difficult to make the device smaller. There has also ultimately been a risk of cracks or elasticity problems arising in the wires on the inorganic insulating film.

The interlayer insulating film is made from a resin in the bridged areas according to Japanese Unexamined Patent Application Publication No. 2009-182407. The surface of the interlayer insulating film is rounded as a result. This makes it difficult for cracks, wire breakage, and so on to form in wires in upper areas.

However, with an interlayer insulating film made from a resin, there is still a large difference in the coefficient of linear expansion between the piezoelectric substrate and the resin, and thus there is a problem that a large amount of thermal stress arises in the wires on the insulating layer.

SUMMARY OF THE INVENTION

Preferred embodiments of the present invention provide an elastic wave device including an interlayer insulating film made from an inorganic dielectric material, in which it is difficult for cracks and wire breakage to occur in wires on the interlayer insulating film.

An elastic wave device according to a preferred embodiment of the present invention includes a piezoelectric substrate; a plurality of interdigital transducer electrodes provided on the piezoelectric substrate; and a plurality of wires, provided on the piezoelectric substrate, electrically connected to the plurality of interdigital transducer electrodes. The plurality of wires includes a first wire and a second wire connected to a different potential from the first wire. The device further includes an interlayer insulating film made from an inorganic dielectric material, provided on the piezoelectric substrate so as to cover a part of the first wire. A portion of the second wire bridges a portion of the first wire with the interlayer insulating film provided therebetween. The device further includes a first auxiliary wire electrode, extending from a region on an outer side portion of the interlayer insulating film to a region where the interlayer insulating film is provided at the bridged area, being laminated to a lower surface of the second wire at the region on the outer side portion of the interlayer insulating film, and being located below the interlayer insulating film and the second wire at the region where the interlayer insulating film is provided.

According to a specific aspect of an elastic wave device according to a preferred embodiment of the present invention, the first auxiliary wire electrode is provided on both one side and another side of the first wire at the bridged area. In this case, it is possible to effectively suppress cracks and wire breakage problems in the second wire on both the one side and the other side of the first wire.

According to another specific aspect of an elastic wave device according to a preferred embodiment of the present invention, the interlayer insulating film includes first and second side surfaces located on one side and another side of the first wire, the first side surface and the second side surface are sloping surfaces that slope toward a center area of the interlayer insulating film as the side surfaces progress upward, and in the region on the outer side portion of the interlayer insulating film, a border surface between the first auxiliary wire electrode and the second wire slopes upward as the border surface nears the interlayer insulating film. A slope angle of the first and second side surfaces of the interlayer insulating film relative to an upper surface of the piezoelectric substrate is greater than a slope angle of the border surface between the first auxiliary wire electrode and the second wire relative to the upper surface of the piezoelectric substrate. In this case, it is possible to more effectively suppress cracks and wire breakage problems in the second wire.

According to another specific aspect of an elastic wave device according to a preferred embodiment of the present invention, a surface roughness at an area of the first auxiliary wire electrode where the second wire is laminated is higher than a surface roughness at an area of the first auxiliary wire electrode covered by the interlayer insulating film. In this case, the strength of close contact between layers is effectively increased.

According to yet another specific aspect of an elastic wave device according to a preferred embodiment of the present invention, an area of the first auxiliary wire electrode that makes contact with the second wire is an Al alloy layer containing Cu, and includes a protrusion made from a $CuAl_2$ intermetallic compound. In this case, the surface roughness is effectively increased.

According to another specific aspect of an elastic wave device according to a preferred embodiment of the present invention, the device further includes a second auxiliary wire electrode, extending in the direction in which the first wire extends, laminated to the first wire in a region on an outer side portion of the interlayer insulating film, extending to the top of the interlayer insulating film, and separated from the second wire. In this case, the influence of etching or the like of the first wire is reduced, and an increase in wiring resistance is suppressed.

According to another specific aspect of an elastic wave device according to a preferred embodiment of the present invention, the slope angle of the first and second side surfaces of the interlayer insulating film is no greater than about 50°, for example. In this case, it is possible to more effectively suppress cracks and wire breakage in the second wire.

According to another specific aspect of an elastic wave device according to a preferred embodiment of the present invention, the first and second side surfaces of the interlayer insulating film include a lower side surface portion in which the slope angle is relatively great and an upper side surface portion in which the slope angle is relatively small.

According to still another specific aspect of an elastic wave device according to a preferred embodiment of the present invention, the interlayer insulating film includes a first dielectric material layer made from a first inorganic dielectric material and a second dielectric material layer laminated on the first dielectric material layer.

According to still another specific aspect of an elastic wave device according to a preferred embodiment of the present invention, the interlayer insulating film includes a first dielectric material layer made from a first inorganic dielectric material and a second dielectric material layer made from a second inorganic dielectric material that is different from the first inorganic dielectric material, a side surface of the first dielectric material layer defining the lower side surface portion and a side surface of the second dielectric material layer defining the upper side surface portion.

According to another specific aspect of an elastic wave device according to a preferred embodiment of the present invention, the device further includes a support member on the piezoelectric substrate and surrounding the interdigital transducer electrodes such that a hollow area facing the interdigital transducer electrodes is provided; and a cover material located on the support member to seal the hollow area.

According to another specific aspect of an elastic wave device according to a preferred embodiment of the present invention, the support member extends to above at least one of the bridged areas.

A method of manufacturing an elastic wave device according to a preferred embodiment of the present invention is a method for obtaining the elastic wave device configured according to other preferred embodiments of the present invention, and includes forming the interdigital transducer electrodes on the piezoelectric substrate; forming the first auxiliary wire electrode on the piezoelectric substrate; forming the interlayer insulating film on the piezoelectric substrate so as to cover a portion of the first wire and a portion of the first auxiliary wire electrode; and forming the second wire on the piezoelectric substrate so as to extend in a direction intersecting with the first wire in the interlayer insulating film.

According to a specific aspect of a method of manufacturing the elastic wave device according to a preferred embodiment of the present invention, the first auxiliary wire electrode is formed through a photolithography-etching technique.

According to another specific aspect of a method of manufacturing the elastic wave device according to a preferred embodiment of the present invention, the interlayer insulating film is formed by dry etching the interlayer insulating film.

According to still another specific aspect of a method of manufacturing the elastic wave device according to a preferred embodiment of the present invention, the interlayer insulating film includes a first inorganic dielectric material layer made from a first inorganic dielectric material and a second inorganic dielectric material layer made from a second inorganic dielectric material that is different from the first inorganic dielectric material, and when forming the first inorganic dielectric material layer and the second inorganic dielectric material layer through an etching technique, an etching rate of the first inorganic dielectric material layer is higher than an etching rate of the second inorganic dielectric material layer.

According to elastic wave devices and manufacturing methods thereof according to preferred embodiments of the present invention, it is possible to effectively suppress cracks and wire breakage in the second wire at a wire bridged area that uses an inorganic dielectric material.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through descriptions of specific preferred embodiments of the present invention with reference to the drawings.

Note that the various preferred embodiments disclosed in the present specification are merely examples, and it is to be understood that partial replacements or combinations of configurations among different preferred embodiments are also possible.

Figure 2A:
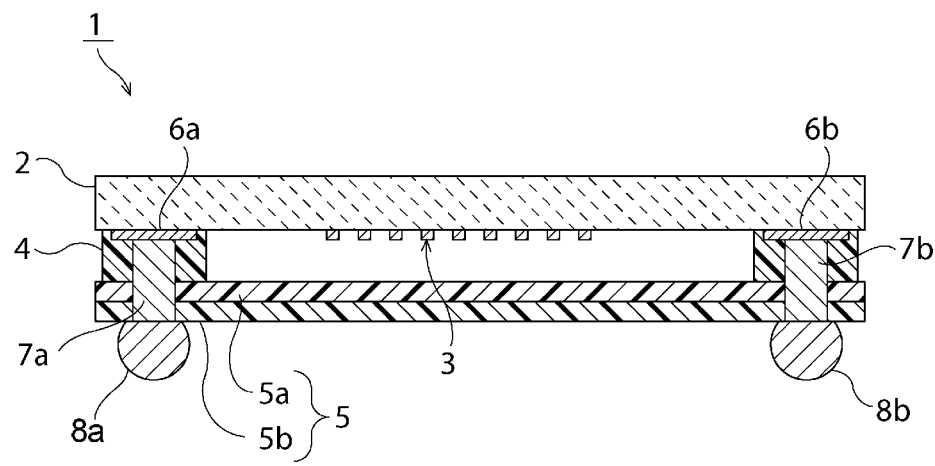
FIGS. 2A and 2B are a forward cross-sectional view of the elastic wave device according to the first preferred embodiment of the present invention, and a schematic plan view of an electrode structure on a piezoelectric substrate thereof, respectively.
Figure 2B:
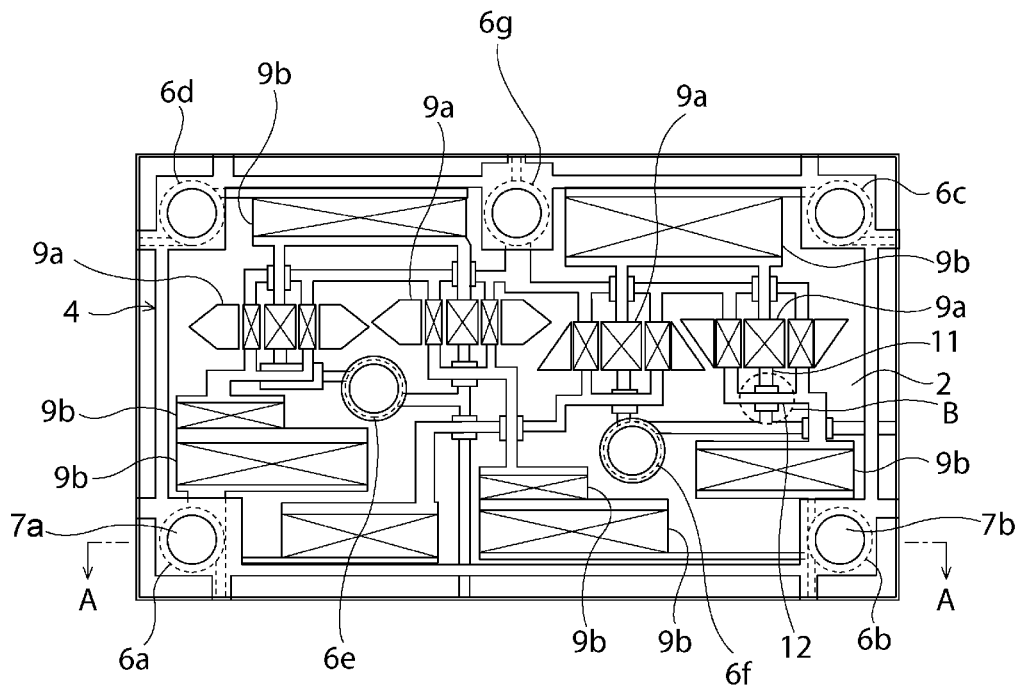

FIGS. 2A and 2B are a forward cross-sectional view of an elastic wave device according to a first preferred embodiment of the present invention, and a schematic plan view of an electrode structure on a piezoelectric substrate thereof, respectively. The structure is illustrated schematically as a plan view in FIG. 2B without a cover material 5 and bumps 8a and 8b, which are illustrated in FIG. 2A. Furthermore, FIG. 2A illustrates a cross-section of an elastic wave device 1 at an area thereof taken along a line A-A in FIG. 2B.

The elastic wave device 1 includes a piezoelectric substrate 2. The piezoelectric substrate 2 preferably is made of a piezoelectric single-crystal such as $LiTaO_3$ or $LiNbO_3$. The piezoelectric substrate 2 may be made of piezoelectric ceramics.

At least one interdigital transducer electrode 3 is provided on the piezoelectric substrate 2. In reality, a plurality of interdigital transducer electrodes are provided so as to define an elastic wave filter. FIG. 2B schematically indicates portions where interdigital transducer electrodes and reflectors are defined by symbols in which an X is enclosed in a rectangle.

To be more specific, three IDT-type longitudinally coupled resonator-type elastic wave filters 9a and a plurality of elastic wave resonators 9b are provided on the piezoelectric substrate 2. In each longitudinally coupled resonator-type elastic wave filter 9a, three interdigital transducer electrodes are provided along an elastic wave propagation direction. Reflectors are provided on both sides of the region where these three interdigital transducer electrodes are provided. In other words, each longitudinally coupled resonator-type elastic wave filter 9a preferably is a three IDT-type longitudinally coupled resonator-type elastic wave filter. Each of the plurality of elastic wave resonator 9b preferably is a single-port resonator in which reflectors are provided on both sides of the interdigital transducer electrodes.

The single-port elastic wave resonators 9b and the longitudinally coupled resonator-type elastic wave filters 9a are electrically connected to each other by wire electrodes 10.

Meanwhile, in order to achieve a smaller size, a plurality of bridged areas B, indicated by broken lines, are provided. A characteristic of the elastic wave device 1 is in a wiring structure at the bridged areas B.

Figure 1A:
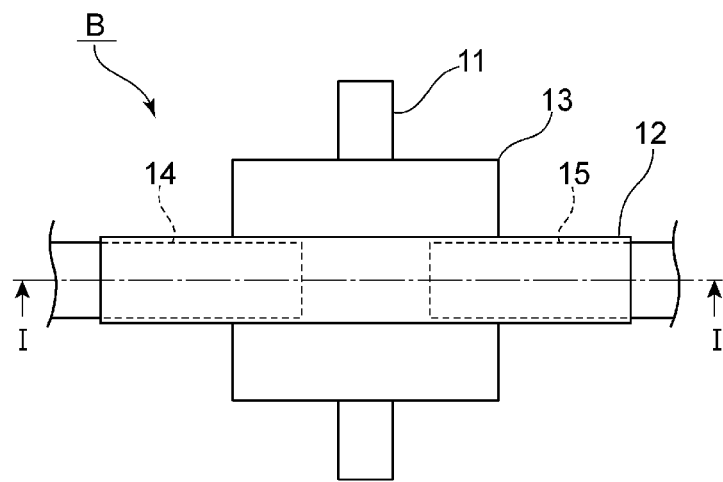
FIGS. 1A and 1B are a partially cut-out plan view of a bridged area in an elastic wave device according to a first preferred embodiment of the present invention in an enlarged manner, and a cross-sectional view taken along a line I-I in FIG. 1A, respectively.
Figure 1B:
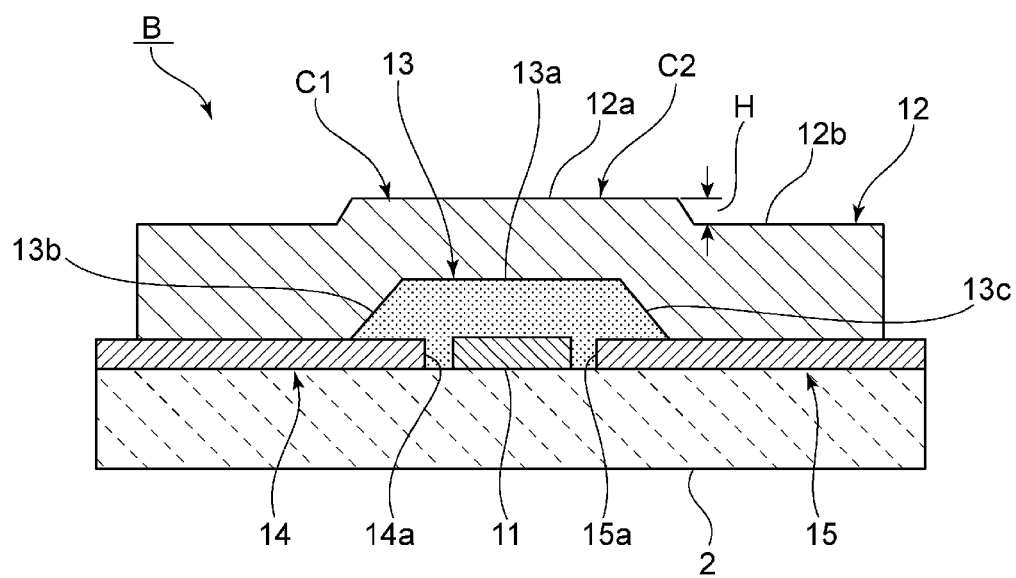

FIGS. 1A and 1B are a partially cut-out plan view illustrating the bridged area B in an enlarged manner, and a cross-sectional view taken along a line I-I in FIG. 1A, respectively.

At the bridged area B, a second wire 12 bridges a first wire 11 with an interlayer insulating film 13 provided therebetween. To be more specific, the first wire 11 extends in a first direction on the piezoelectric substrate 2. Here, the first direction is assumed to be the direction in which the first wire 11 extends at the bridged area B. Note that the second wire 12 is connected to a different potential from the first wire 11.

The interlayer insulating film 13, which is made from an inorganic dielectric material, covers the first wire 11. The second wire 12, which extends in a second direction perpendicular or substantially perpendicular to the first direction, is provided on the interlayer insulating film 13. Accordingly, the first wire 11 and the second wire 12 are insulated from each other by the interlayer insulating film 13.

Note that the direction in which the second wire 12 extends at the bridged area is the second direction. The second direction is not limited to being perpendicular or substantially perpendicular to the first direction, and may be a direction intersecting with the first direction.

One of the unique characteristics of the present preferred embodiment is that the first auxiliary wire electrodes 14 and 15 are provided at the bridged area B.

The first auxiliary wire electrodes 14 and 15 are provided on the piezoelectric substrate 2 and extend in the second direction. The first auxiliary wire electrode 14 is provided on one side of the first wire 11, and the first auxiliary wire electrode 15 is provided on another side of the first wire 11.

The first auxiliary wire electrode 14 extends in the second direction, from a region on an outer side portion of the interlayer insulating film 13 to a region where the interlayer insulating film 13 is provided. The first auxiliary wire electrode 15 also extends in the second direction, from a region on an outer side portion of the area where the interlayer insulating film 13 is provided to a region where the interlayer insulating film 13 is provided. Ultimately, inner end portions 14a and 15a of the first auxiliary wire electrodes 14 and 15, respectively, are separated from each other, with the first wire 11 and the interlayer insulating film 13 provided therebetween. Note that the "inner end portion" is an end portion located toward a central area of the interlayer insulating film 13.

As illustrated in FIG. 1B, the interlayer insulating film 13 includes an upper surface 13a, and first and second side surfaces 13b and 13c. Here, the first side surface 13b and the second side surface 13c are sloped surfaces that slope toward a central portion of the interlayer insulating film 13 as those surfaces progress upward.

The first wire 11 and the second wire 12 are electrically connected to the interdigital transducer electrodes 3 that define the elastic wave resonators 9b and the longitudinally coupled resonator-type elastic wave filters 9a illustrated in FIG. 2B.

It is preferable that the first wire 11 be formed at the same time, and from the same material, as the interdigital transducer electrodes. This makes it possible to simplify the manufacturing process. A metal material from which the first wire 11 and the interdigital transducer electrodes are formed is not particularly limited. A metal such as Al, Pt, Cu, Au, Ti, Ag, W, Ni, Cr, or Mo can be used. The metal is not limited to a pure metal, and may instead be an alloy. Furthermore, the interdigital transducer electrodes and the first wire 11 may be formed from a single metal layer, or may be a laminated metal film formed by laminating a plurality of metal layers.

It is also preferable that the first auxiliary wire electrodes 14 and 15 be formed from the same material, and in the same process, as the first wire 11 and the interdigital transducer electrodes.

In the present preferred embodiment, the first wire 11 and the first auxiliary wire electrodes 14 and 15 are preferably made from a laminated metal film having an AlCu layer in its uppermost area. More specifically, these elements have a structure in which a Ti film and an AlCu layer are laminated on the piezoelectric substrate. The first wire 11, the interdigital transducer electrodes, and the first auxiliary wire electrodes 14 and 15 can be formed through a thin film formation technique such as vapor deposition or sputtering. Preferably, the interdigital transducer electrodes, the first wire 11, and the first auxiliary wire electrodes 14 and 15 are formed in prescribed shapes through etching after a metal film has been formed through such a film formation technique.

The interlayer insulating film 13 is made from an inorganic dielectric material. The material is not particularly limited as long as it is an inorganic dielectric material; for example, silicon oxide, silicon nitride, silicon oxynitride, silicon carbide, tantalum oxide, titanium oxide, titanium nitride, alumina, or the like can be used. The interlayer insulating film 13 is preferably made from silicon oxide in the present preferred embodiment.

The interlayer insulating film 13 is obtained through patterning using a photolithography-etching technique after forming an insulating film through a film formation technique such as sputtering or vapor deposition. The etching technique is not particularly limited, and dry etching, wet etching, or the like may be selected in accordance with the type of the inorganic dielectric material.

Preferably, a thermal process is carried out after a photoresist is formed but before the etching is carried out. Doing so ensures that a cross-sectional shape of the photoresist is rounded, which makes it possible to transfer the rounded cross-sectional shape of the resist to the post-patterning interlayer insulating film 13 through dry etching.

The second wire 12 is formed after the interlayer insulating film 13 is formed. The second wire 12 preferably is made from a laminated film of Ti, AlCu, and Pt in the present preferred embodiment. The material of which the second wire 12 is formed is not particularly limited, and the same metal material as the first wire 11 can be used. The second wire 12, too, may be formed from a single metal layer, or may be a laminated metal film formed by laminating a plurality of metal layers.

It is desirable that a photolithography-etching technique be used to form the second wire 12 as well. In this case, the etching technique is not particularly limited, but preferably, the etching is carried out using an alkali-based developer, as will be described later.

In the elastic wave device 1 according to the present preferred embodiment, the first auxiliary wire electrodes 14 and 15 are provided at the bridged area B, and thus it is difficult for cracks, wire breakage, and so on to arise in the second wire 12 on the interlayer insulating film 13. In the case where the first auxiliary wire electrodes 14 and 15 are not provided, the upper surface of the interlayer insulating film 13 has a different height above the area where the first wire 11 is provided and at an outer side portion thereof in the second direction. In other words, the interlayer insulating film 13 is thicker directly above the area where the first wire 11 is provided, whereas the interlayer insulating film 13 is relatively lower on the outer side portions of the region where the first wire 11 is provided, with respect to the second direction; as a result, steps are formed between the two. Steps are also formed in the second wire 12 above those stated steps, and there is a thus a risk of cracks, wire breakage, and so on arising in the second wire at those steps when a thermal shock or the like is applied thereto.

In response to this, in the present preferred embodiment, the first auxiliary wire electrodes 14 and 15 are provided such that the inner end portions 14a and 15a thereof extend to an inner portion of the interlayer insulating film 13, and thus the upper surface 13a of the interlayer insulating film 13 does not change significantly between the area above the first wire 11 and the areas on the outer side portions thereof in the second direction. This makes it possible to reliably suppress cracks and wire breakage from occurring in the second wire 12 near areas indicated by arrows C1 and C2 in FIG. 1B.

Although a step equivalent to a height H is present between an upper surface 12a corresponding to an area of the second wire 12 located above the portion where the interlayer insulating film 13 is provided and an upper surface 12b of the second wire 12 at the outer side portion regions thereof, the first auxiliary wire electrodes 14 and 15 are provided, and thus the height H of the step can be made as small as the thickness of the first auxiliary wire electrodes 14 and 15. This also makes it possible to suppress cracks and wire breakage from arising near the stated steps.

In Japanese Unexamined Patent Application Publication No. 2009-182407, the interlayer insulating film is made from a resin, and thus the upper surface of the interlayer insulating film has a curved shape, which makes it difficult for cracks and wire breakage to arise in a second wire formed thereon. However, in the case where the interlayer insulating film is formed from an inorganic insulating film, cracks and wire breakage have thus far tended to arise in the second wire formed thereon when thermal shocks or the like are applied, due to non-planarities in the upper surface of the interlayer insulating film. A preferred embodiment of the present invention has been achieved to solve such a problem in configurations where an interlayer insulating film made from an inorganic insulating film is used, and has a characteristic in that the first auxiliary wire electrodes 14 and 15 are provided to solve this problem.

Returning to FIGS. 2A and 2B, the elastic wave device 1 has a characteristic in that the bridged area B is provided; the rest of the structure is the same as in conventional known elastic wave devices. That is, terminal electrodes 6a to 6g are provided on the piezoelectric substrate 2. A support member 4 made from a resin is provided on the terminal electrodes 6a to 6g. Under-bump metal layers 7a and 7b, illustrated in FIG. 2A, pass through the support member 4. The cover material 5 that defines a hollow area is bonded to the top of the support member 4. The cover material 5 has a structure in which a first synthetic resin layer 5a and a second synthetic resin layer 5b are laminated together. However, the cover material 5 may be formed from a single resin layer, or may be formed from a material aside from a resin. The under-bump metal layers 7a and 7b penetrate the cover material 5 and extend to an outer surface of the cover material 5. The bumps 8a and 8b are bonded to the top of the under-bump metal layers 7a and 7b, respectively.

In the elastic wave device 1, a hollow area facing the interdigital transducer electrodes 3 is defined by the piezoelectric substrate 2, the support member 4, and the cover material 5. In other words, the elastic wave device 1 is configured with what is known as a wafer-level package structure (WLP structure).

Elastic wave devices according to other preferred embodiments of the present invention will be described next with reference to FIGS. 3 to 8. In the following, only the bridged area, which is a primary portion, will be described. Elements aside from the bridged area are as described above in the first preferred embodiment, and thus descriptions thereof will be omitted.

Figure 3:
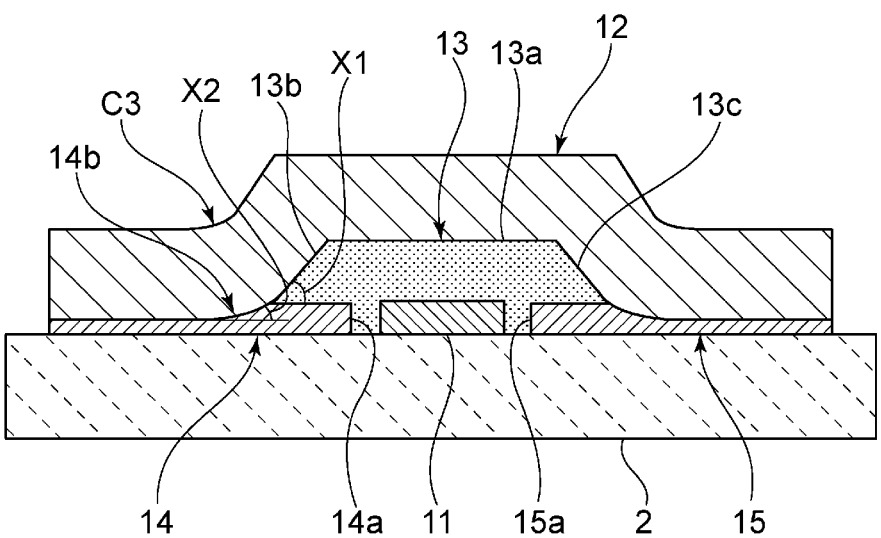
FIG. 3 is a forward cross-sectional view of a bridged area in an elastic wave device according to a second preferred embodiment of the present invention.

FIG. 3 is a forward cross-sectional view illustrating a bridged area in an elastic wave device according to a second preferred embodiment of the present invention.

The first wire 11 and the first auxiliary wire electrodes 14 and 15 are provided on the piezoelectric substrate 2. Furthermore, the interlayer insulating film 13 covers the first wire 11. As in the first preferred embodiment, the first auxiliary wire electrodes 14 and 15 are structured such that the inner end portions 14a and 15a thereof, respectively, extend to regions where the interlayer insulating film 13 is provided. The second wire 12 extending in the second direction covers the interlayer insulating film 13.

Border surfaces between each of the first auxiliary wire electrodes 14 and 15 and the second wire 12 are sloped so as to rise upward as those faces near the interlayer insulating film 13.

The second preferred embodiment differs from the first preferred embodiment in that a slope angle X1 of the first side surface 13b located on the outer side portion of the interlayer insulating film 13 in the second direction in FIG. 3 is greater than a slope angle X2 of the sloping area at the border surface between the first auxiliary wire electrode 14 and the second wire 12. As a result, it is possible to make the change in the upper surface of the second wire 12 at the step portion more gradual, as indicated by the arrow C3 in FIG. 3. Accordingly, cracks and wire breakage at the portion indicated by the arrow C3 are suppressed. The slope angle of the second side surface 13c of the interlayer insulating film 13 on the other side of the first wire 11 is also greater than the slope angle of the sloping area at the border surface between the first auxiliary wire electrode 15 and the second wire 12. As a result, it is possible to make the change in the upper surface of the second wire 12 at the step portion more gradual, in the same manner as on the first auxiliary wire electrode 14 side. Preferably, the slope angle of the first and second side surfaces 13b and 13c is no greater than about 50°, for example. This makes it possible to effectively suppress cracks and wire breakage in the second wire 12.

Such a structure is able to be achieved by etching the uppermost layer of the first auxiliary wire electrodes 14 and 15 using an etching developer when patterning the second wire 12. For example, in the case where the surface layer of the first auxiliary wire electrodes 14 and 15 is a material that takes Al as its primary component, such as Al or an AlCu alloy, it is desirable to carry out the etching using an alkali-based developer. As a result, the surface layer of the first auxiliary wire electrodes 14 and 15 is etched, and the slope angle X2 at the stated sloping area at the border surface between the second wire 12 and the first auxiliary wire electrodes 14 and 15 are able to be made smaller than the slope angle X1.

Figure 4:
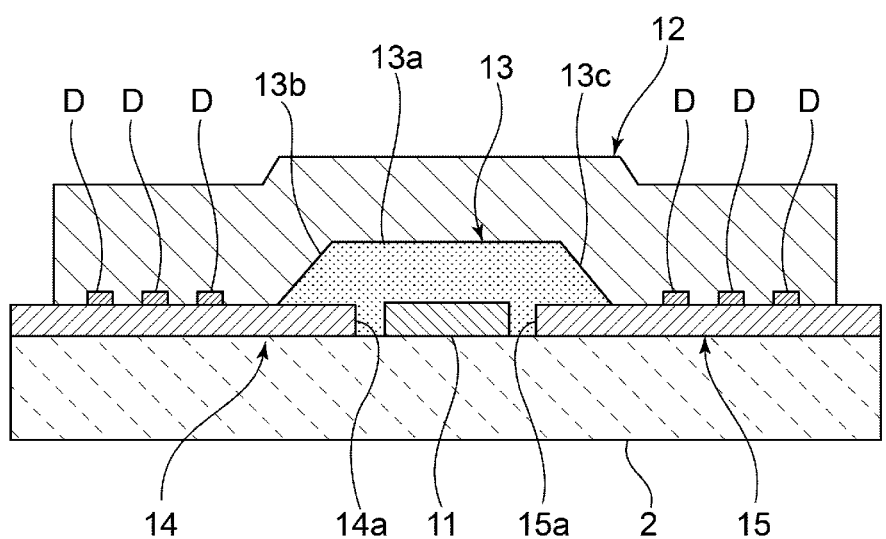
FIG. 4 is a forward cross-sectional view of a bridged area in an elastic wave device according to a third preferred embodiment of the present invention.

FIG. 4 is a forward cross-sectional view of a bridged area in an elastic wave device according to a third preferred embodiment of the present invention. In the third preferred embodiment, a surface roughness of the surface where the first auxiliary wire electrodes 14 and 15 make contact with the second wire 12 is set to be rougher than a surface roughness of the upper surfaces of the first auxiliary wire electrodes 14 and 15 in regions thereof that are covered by the interlayer insulating film 13. Accordingly, the level of close contact between the first auxiliary wire electrodes 14 and 15 and the second wire 12 is able to be increased. With respect to other configurations, the third preferred embodiment is the same as the first preferred embodiment. Accordingly, the same actions and effects as in the first preferred embodiment are able to be achieved.

In the third preferred embodiment, the surface roughness of the upper surfaces of the first auxiliary wire electrodes 14 and 15 is made relatively rougher at the portions where the second wire 12 is laminated. That is, a plurality of protrusions D are preferably provided. These protrusions are able to be formed through a variety of methods. Preferably, the protrusions can be formed through etching after forming the first auxiliary wire electrodes 14 and 15 and the interlayer insulating film 13. For example, in the case where the upper surfaces of the first auxiliary wire electrodes 14 and 15 are an Al-based alloy containing Cu, it is desirable that the etching be carried out using an alkali-based developer. In this case, the protrusions D preferably are formed from a $CuAl_2$ intermetallic compound. This is because a layer containing a $CuAl_2$ intermetallic compound and a layer made from an Al-α solid solution have different etching rates with respect to alkali. As a result, the protrusions D are able to be provided on the upper surfaces of the first auxiliary wire electrodes 14 and 15, which makes it possible to increase the surface roughness.

Note that the alloy is not limited to an Al—Cu alloy, and the same effects are able to be achieved in the case where another Al-based alloy containing Cu is used, such as an Al—Cu—Mg alloy or an Al—Cu—Si alloy.

With the elastic wave device according to the third preferred embodiment, forming the protrusions D increases the strength of the close contact between the first auxiliary wire electrodes 14 and 15 and the second wire 12, which suppresses peeling of the second wire 12. Furthermore, contact is made across a greater surface area, which makes it possible to reduce electrical contact resistance between the first auxiliary wire electrodes 14 and 15 and the second wire 12. Furthermore, an oxide layer on the surface layer that takes Al as its primary component has less influence, which also makes it possible to reduce the stated contact resistance.

Figure 5A:
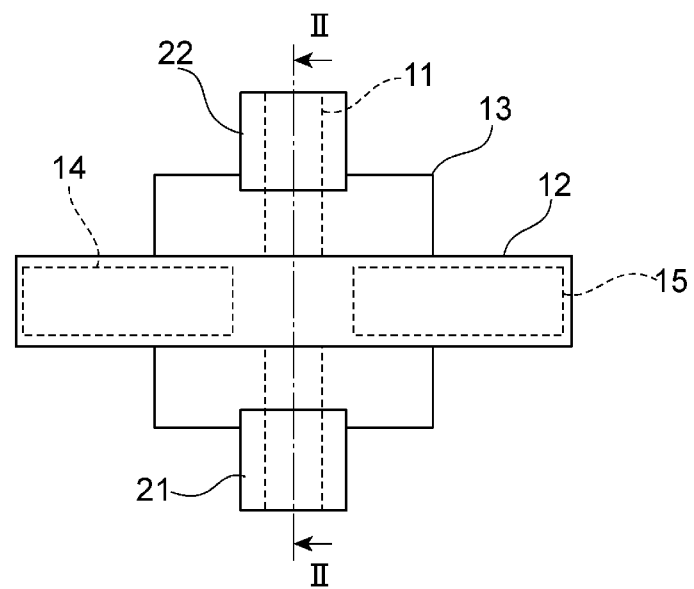
FIGS. 5A and 5B are a partially cut-out plan view of a bridged area in an elastic wave device according to a fourth preferred embodiment of the present invention, and a cross-sectional view of a portion along a line II-II in FIG. 5A, respectively.
Figure 5B:
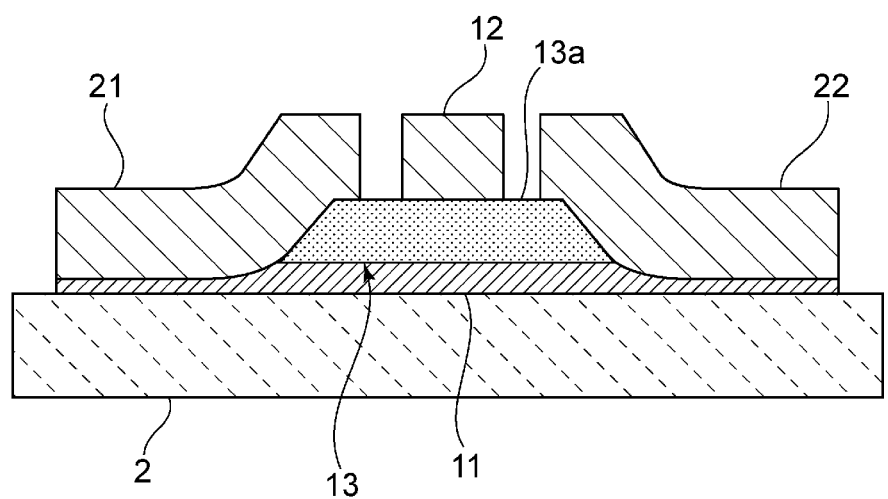

FIGS. 5A and 5B are a partially cut-out plan view of a bridged area according to a fourth preferred embodiment of the present invention, and a cross-sectional view taken along a line II-II in FIG. 5A, respectively.

As is clear from FIG. 5A, a surface following the line II-II is a cross-section extending in the first direction. In the present preferred embodiment, second auxiliary wire electrodes 21 and 22 extend from outer side portions of the interlayer insulating film 13 to above the interlayer insulating film 13 in the first direction. The second auxiliary wire electrodes 21 and 22 are separated by the second wire 12. With respect to other configurations, the present preferred embodiment is the same as the first preferred embodiment. Accordingly, the same structure as the structure illustrated in FIG. 1B is provided in the second direction in which the second wire 12 extends, and the same actions and effects are achieved.

In the fourth preferred embodiment, the second auxiliary wire electrodes 21 and 22 extend from portions covered by the first wire 11 to the upper surface of the interlayer insulating film 13, with respect to the first direction. Accordingly, wiring resistance in the first wire 11 is reduced. Particularly, when the first wire 11 is etched after the interlayer insulating film 13 has been formed, the first wire 11 has a lower film thickness in portions not covered by the interlayer insulating film 13, as illustrated in FIG. 5B. Accordingly, there is a risk of increased wiring resistance in the first wire 11. However, in the present preferred embodiment, the second auxiliary wire electrodes 21 and 22 are laminated, and thus an increase in the wiring resistance in the first wire 11 is suppressed.

The second auxiliary wire electrodes 21 and 22 can be formed from a suitable metal or alloy. The electrodes are not limited to a single metal film, and a laminated metal may be used instead.

Figure 6A:
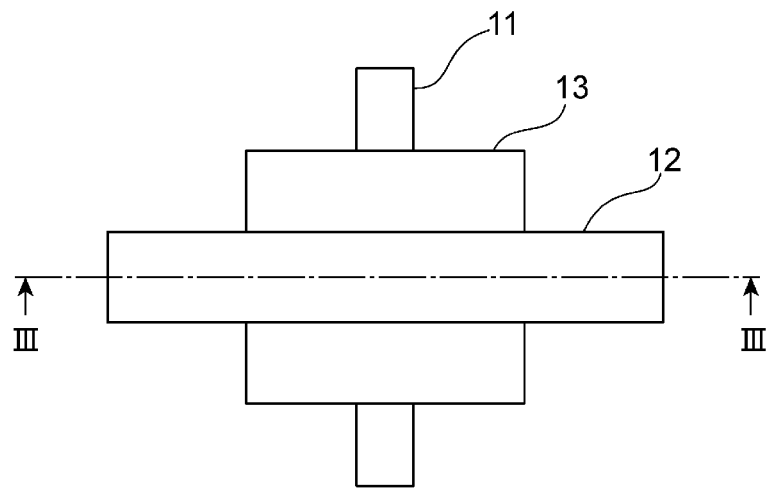
FIGS. 6A and 6B are a partially cut-out plan view of a bridged area in an elastic wave device according to a fifth preferred embodiment of the present invention, and a cross-sectional view of a portion along a line III-III in FIG. 6A, respectively.
Figure 6B:
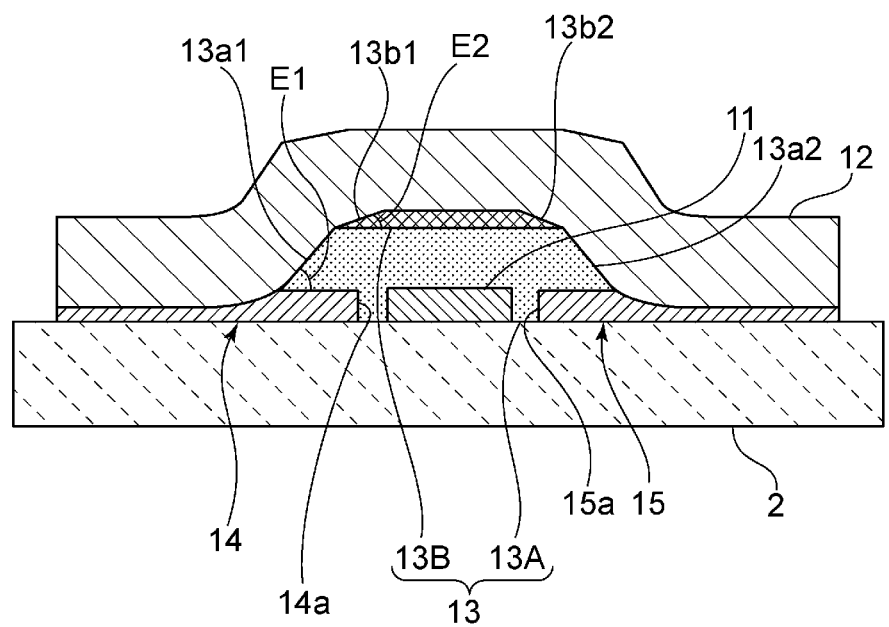

FIGS. 6A and 6B are a partially cut-out plan view of a bridged area in an elastic wave device according to a fifth preferred embodiment of the present invention, and a cross-sectional view taken along a line III-III in FIG. 6A, respectively.

In the present preferred embodiment as well, the second wire 12 bridges the first wire 11 with the interlayer insulating film 13 provided therebetween. Additionally, as in the first and second preferred embodiments, the first auxiliary wire electrodes 14 and 15 are provided.

The fifth preferred embodiment differs from the first preferred embodiment and the second preferred embodiment in that the interlayer insulating film 13 has a lower first interlayer insulating film layer 13A formed from a first dielectric material layer, and a second interlayer insulating film layer 13B formed from a second dielectric material layer provided on the first interlayer insulating film layer 13A. Here, a slope angle E1 of side surfaces 13a1 and 13a2 of the first interlayer insulating film layer 13A relative to an upper surface of the piezoelectric substrate 2 is greater than a slope angle E2 of side surfaces 13b1 and 13b2 of the second interlayer insulating film layer 13B relative to the upper surface of the piezoelectric substrate 2.

Accordingly, there is a gradual change in the second wire 12 above an area spanning from the side surfaces 13a1 and 13a2 to the side surfaces 13b1 and 13b2. This makes it possible to more effectively suppress cracks and wire breakage in the second wire 12.

Note that the first interlayer insulating film layer 13A and the second interlayer insulating film layer 13B can be formed by transferring a cross-sectional shape of a resist. In other words, when a thermal process is carried out after the photoresist is formed, the cross-sectional shape of the patterned resist is rounded. If dry etching is carried out in this state, the rounded cross-sectional shape of the resist can be transferred to the first and second interlayer insulating film layers 13A and 13B. Additionally, the cross-sectional shape of the resist may be varied between the case where the first interlayer insulating film layer 13A is formed and the case where the second interlayer insulating film layer 13B is formed.

In this case, the first interlayer insulating film layer 13A and the second interlayer insulating film layer 13B may be formed from the same material or from different materials.

Figure 7A:
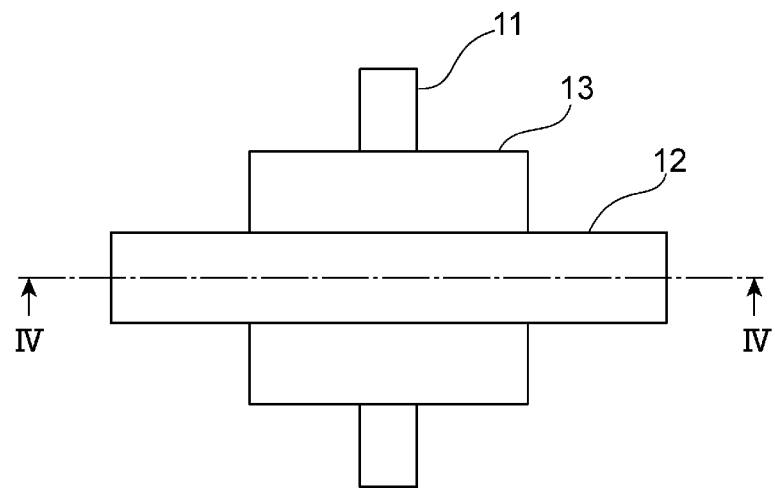
FIGS. 7A and 7B are a partially cut-out plan view of a bridged area in an elastic wave device according to a sixth preferred embodiment of the present invention, and a cross-sectional view of a portion along a line IV-IV in FIG. 7A, respectively.
Figure 7B:
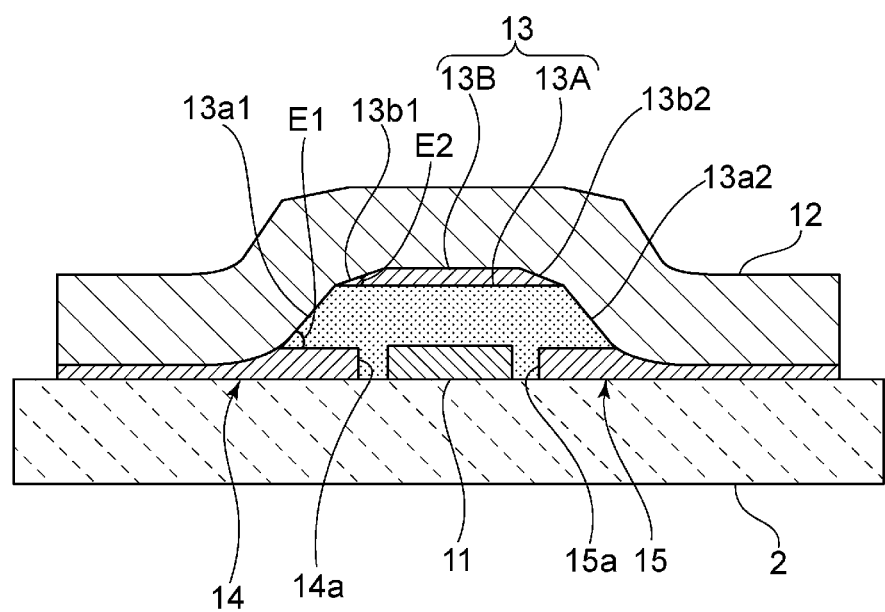

FIGS. 7A and 7B are a partially cut-out plan view for illustrating a bridged area in an elastic wave device according to a sixth preferred embodiment, and a cross-sectional view taken along a line IV-IV in FIG. 7A, respectively.

Like the fifth preferred embodiment, in the sixth preferred embodiment, the interlayer insulating film 13 includes the first interlayer insulating film layer 13A and the second interlayer insulating film layer 13B. Here, the first interlayer insulating film layer 13A and the second interlayer insulating film layer 13B are formed from different dielectric materials. The first interlayer insulating film layer 13A and the second interlayer insulating film layer 13B are formed through etching after the insulating layer has been formed. In this case, preferably, dry etching is carried out so that the etching rate when patterning the first interlayer insulating film layer 13A is higher than the etching rate of the etching for forming the second interlayer insulating film layer 13B. As a result, the slope angle E1 can be made greater than the slope angle E2, as illustrated in FIG. 7B. In other words, the same slope angle relationship as in the fifth preferred embodiment is able to be achieved.

Accordingly, like the fifth preferred embodiment, a change in the second wire 12 is able to be made gradual above portions where the first interlayer insulating film layer 13A and the second interlayer insulating film layer 13B are connected in the sixth preferred embodiment as well. This makes it possible to more effectively suppress cracks and wire breakage in the second wire 12.

Figure 8:
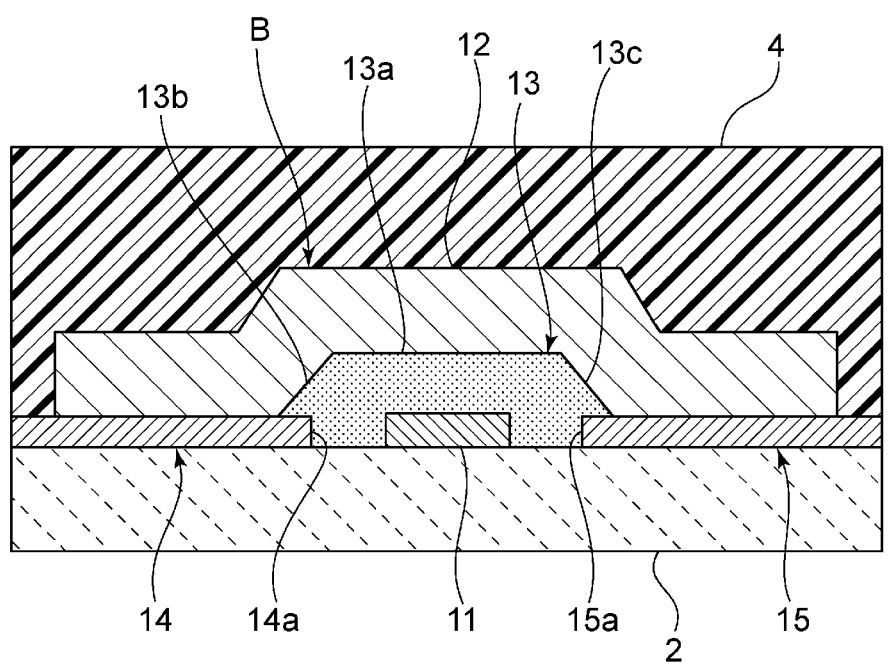
FIG. 8 is a forward cross-sectional view of a bridged area in an elastic wave device according to a seventh preferred embodiment of the present invention.

The bridged areas according to the above-described first to sixth preferred embodiments may be exposed above the piezoelectric substrate 2, or may be covered by a support member made from a resin or the like. In other words, in the elastic wave device 1 according to the first preferred embodiment, the hollow area is preferably formed by using the support member 4 made from a resin, as illustrated in FIGS. 2A and 2B. To make the device smaller, the bridged area may be covered by this support member 4 as illustrated in FIG. 8. In a seventh preferred embodiment illustrated in FIG. 8, the bridged area is the same as that illustrated in FIG. 1B. Even if the support member 4 is formed on the bridged area B, stress acting on the second wire 12 is able to be reduced by providing the first auxiliary wire electrodes 14 and 15. In other words, although there is a risk of pressure being produced during the formation of a resin layer defining the support member 4 and causing warping and wire breakage in the second wire 12 and so on, the risk of cracks and wire breakage arising in the second wire 12 can be reduced as described above. As such, the support member 4 may be provided to cover the bridged area B. This makes it possible to reduce the size of the elastic wave device 1 and increase the freedom with which the elastic wave device 1 can be designed.

Note that the present invention is not limited to an elastic wave device having a WLP structure as described above, and can be used widely in elastic wave devices having a variety of structures.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a piezoelectric substrate;
    a plurality of interdigital transducer electrodes provided on the piezoelectric substrate; and
    a plurality of wires provided on the piezoelectric substrate and electrically connected to the plurality of interdigital transducer electrodes; wherein
    the plurality of wires includes a first wire and a second wire connected to a different potential from the first wire;
    the device further comprises an interlayer insulating film made from an inorganic dielectric material and provided on the piezoelectric substrate to cover a portion of the first wire;

a portion of the second wire bridges a portion of the first wire with the interlayer insulating film provided therebetween to define a bridged area;

the device further comprises a first auxiliary wire electrode, extending from a region on an outer side portion of the interlayer insulating film to a region where the interlayer insulating film is provided at the bridged area, being laminated to a lower surface of the second wire at the region on the outer side portion of the interlayer insulating film, and being located below the interlayer insulating film and the second wire at the region where the interlayer insulating film is provided at the bridged area;

the interlayer insulating film includes first and second side surfaces located on one side and another side of the first wire, the first side surface and the second side surface are sloping surfaces that slope toward a center area of the interlayer insulating film as the side surfaces progress upward, and in the region on the outer side portion of the interlayer insulating film, a border surface between the first auxiliary wire electrode and the second wire slopes upward as the border surface nears the interlayer insulating film; and a slope angle of the first and second side surfaces of the interlayer insulating film relative to an upper surface of the piezoelectric substrate is greater than a slope angle of the border surface between the first auxiliary wire electrode and the second wire relative to the upper surface of the piezoelectric substrate.

2. The elastic wave device according to claim 1, wherein the first auxiliary wire electrode is provided on both one side and another side of the first wire at the bridged area.

3. The elastic wave device according to claim 1, wherein a surface roughness at an area of the first auxiliary wire electrode where the second wire is laminated is higher than a surface roughness at an area of the first auxiliary wire electrode covered by the interlayer insulating film.

4. The elastic wave device according to claim 3, wherein an area of the first auxiliary wire electrode that makes contact with the second wire is an Al alloy layer containing Cu, and includes a protrusion made from a $CuAl_2$ intermetallic compound.

5. The elastic wave device according to claim 1, further comprising a second auxiliary wire electrode extending in a direction in which the first wire extends, laminated to the first wire in a region on an outer side portion of the interlayer insulating film, extending to the top of the interlayer insulating film, and separated from the second wire.

6. The elastic wave device according to claim 1, wherein the slope angle of the first and second side surfaces of the interlayer insulating film is no greater than about 50°.

7. The elastic wave device according to claim 1, wherein the first and second side surfaces of the interlayer insulating film include a lower side surface portion in which the slope angle is relatively great and an upper side surface portion in which the slope angle is relatively small.

8. The elastic wave device according to claim 1, wherein the interlayer insulating film includes a first dielectric material layer made from a first inorganic dielectric material and a second dielectric material layer laminated on the first dielectric material layer.

9. The elastic wave device according to claim 7, wherein the interlayer insulating film includes a first dielectric material layer made from a first inorganic dielectric material and a second dielectric material layer made from a second inorganic dielectric material that is different from the first inorganic dielectric material, a side surface of the first dielectric material layer defining the lower side surface portion and a side surface of the second dielectric material layer defining the upper side surface portion.

10. The elastic wave device according to claim 1, further comprising:
a support member provided on the piezoelectric substrate and surrounding the interdigital transducer electrodes such that a hollow area facing the interdigital transducer electrodes is defined; and
a cover provided on the support member and sealing the hollow area.

11. The elastic wave device according to claim 10, wherein the support member extends to above at least one of the bridged areas.

* * * * *